(12) United States Patent
Bergstedt

(10) Patent No.: US 6,174,562 B1
(45) Date of Patent: *Jan. 16, 2001

(54) METHOD AND DEVICE ON PRINTED BOARDS

(75) Inventor: Leif Roland Bergstedt, Sjömarken (SE)

(73) Assignee: Telefonaktiebolaget LM Ericsson (publ), Stockholm (SE)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/888,054

(22) Filed: Jul. 3, 1997

(30) Foreign Application Priority Data

Jul. 9, 1996 (SE) .................................................. 9602718

(51) Int. Cl.$^7$ ........................................................ B05D 5/12
(52) U.S. Cl. .................... 427/97; 427/282; 427/372.2; 427/468; 427/510
(58) Field of Search .............................. 427/97, 510, 512, 427/468, 282, 555, 558; 430/311; 228/248.1, 280.21, 254

(56) References Cited

U.S. PATENT DOCUMENTS

| | | | |
|---|---|---|---|
| 4,230,793 | * 10/1980 | Losert et al. | 430/315 |
| 5,134,056 | * 7/1992 | Schmidt et al. | 430/313 |
| 5,373,985 | 12/1994 | Chiba et al. | |
| 5,402,314 | * 3/1995 | Amago et al. | 361/760 |

FOREIGN PATENT DOCUMENTS

| | | |
|---|---|---|
| 0 433720 A2 | 11/1990 | (EP) . |
| 2 200 253 | 6/1987 | (GB) . |
| 6880 | * 1/1991 | (JP) . |
| 97588 | * 3/1992 | (JP) . |

OTHER PUBLICATIONS

PCT Search Report, SE 96/00799, Feb. 19, 1997.

* cited by examiner

*Primary Examiner*—Brian K. Talbot
(74) *Attorney, Agent, or Firm*—Burns, Doane, Swecker & Mathis, L.L.P.

(57) ABSTRACT

The present invention relates to a solder stop in through-plated through-holes on micro strip boards (8). A solder resist lacquer (18) with a certain viscosity is applied on a micro strip board (8) wherein the solder resist lacquer (18) flows out over the micro strip (8) and down into a top portion of the through-plated through-hole and dried. A ring-shaped portion of the solder resist lacquer (18) is retained in the top part of the through-plated through-hole.

15 Claims, 6 Drawing Sheets

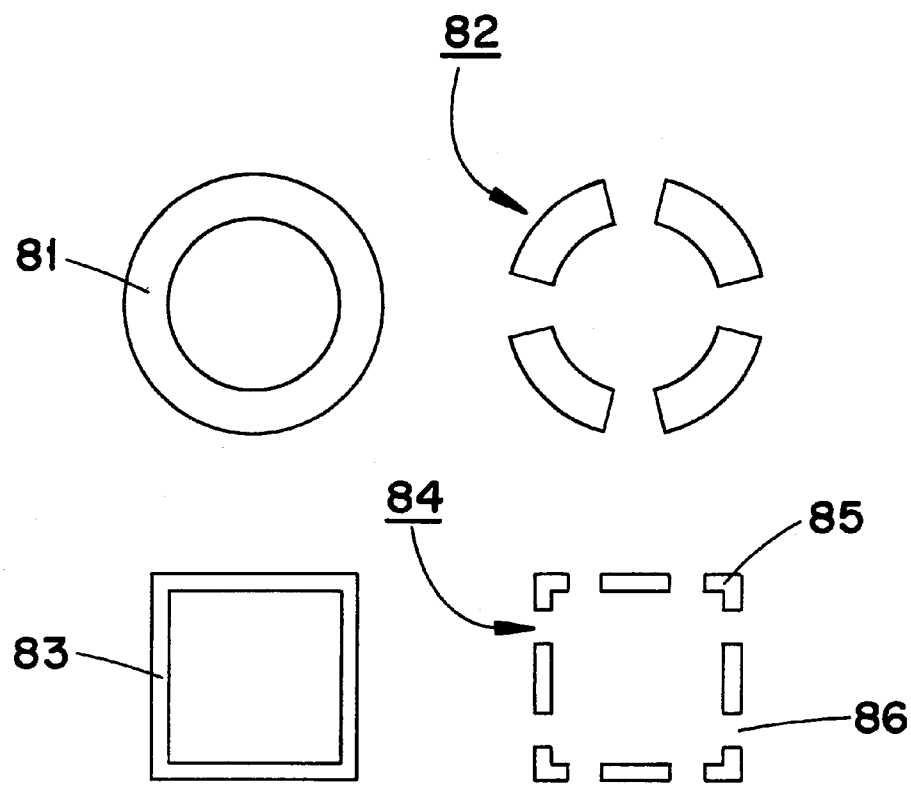
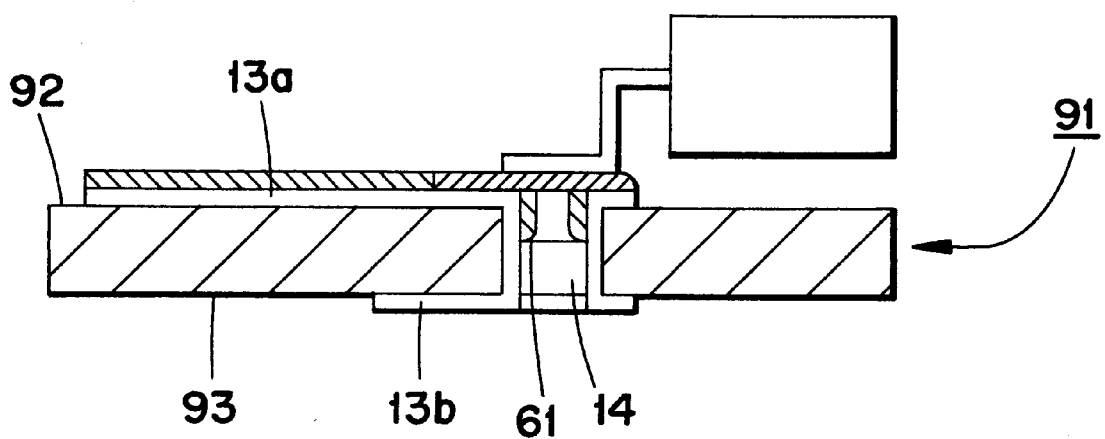
Fig. 8
Fig. 9

METHOD AND DEVICE ON PRINTED BOARDS

THE FIELD OF THE INVENTION

The present invention relates to a method and a device for manufacturing of solder stops in plated through-holes in printed boards and a solder stop for improving the solder quality in soldering connected to through-holes.

STATE OF THE ART

A product which consists of an electrically insulated material with a pattern of an electrically conducting material, e.g. a printed board, often comprises a protective layer of lacquer on predetermined surfaces of the product. In the case that only certain parts of the pattern are to be coated with solder, then the other parts are delimited or covered with a so-called solder resist lacquer. The lacquer prevents on the one hand that bridges of solder occur between adjacent electrically conducting surfaces and on the other hand that solder flows out along the pattern. The solder resist lacquer also function as an insulating protection against moisture, particles, components and corrosion which can damage the electrically conducting material. Certain types of solder resist lacquer comprises i.a. a type of curing agent which reacts to UV-light and to heat.

There are often so-called plated through-holes in printed boards. These holes go straight through the printed board whereby the holes are coated with a conducting material (plating). A through-hole is used, for example, for connecting an electrically conducting surface on one side of the printed board to an earth plane on the other side of the printed board.

The solder resist lacquer can be applied on the printed board by a number of known methods. Many of these methods imply that the solder resist lacquer on certain occasions can flow down into the through-holes on the printed board. This is considered to be a big disadvantage and an example of bad process control, whereby the printed board becomes the subject of a complaint. In European Patent Application EP-A2-0 433 720 a method is described in which solder resist lacquer is removed from a through-hole in a printed board assembly. The method comprises that the solder resist lacquer is coated with a layer of photo resist. U.S. Pat. No. 4,230,793 also relates to a method for coating a printed board with solder resist lacquer. The through-holes on the printed board are carefully cleaned of solder resist lacquer.

In order to save space on the printed board or form shorter connections, a through-hole can be placed under or close to a pad. A pad is the surface of the electrically conducting material to which a component is connected.

During so-called re-flow soldering of a printed board assembly it can occur that the solder to which the components are attached flows down into the through-hole. This can occur without hindrance in the case that the metal surface of the through-hole has been laid bare, for example, with the above mentioned method. The soldered joints are thereby impaired.

In order to prevent solder from being able to flow down into an adjacent through-hole during re-flow soldering it is also earlier known to seal the through-hole with an epoxy paste.

DISCLOSURE OF THE INVENTION

The present invention tackles a problem which occurs during re-flow soldering of a printed board assembly, i.e. a printed board with soldered components which are connected to surfaces with plated through-holes. More precisely, the problem occurs in the case where the solder on a printed board assembly during re-flow soldering becomes liquid and flows down in the through-holes. This means that the quality of the soldering deteriorates.

A similar problem occurs during wave soldering and drag soldering, where the solder can unintentionally climb up into the through-holes.

The object of the present invention is consequently to prevent solder from passing through a through-hole, e.g. a plated through-hole, during different types of soldering.

The invention gives a method, a device which is used during the method and a solder stop for solving said problems. The inventive idea is that by using the earlier mentioned disadvantage where solder resist lacquer in certain situations flows down into the through-holes, through influencing the viscosity of the solder resist lacquer so that a certain quantity of lacquer intentionally flows down into the through-holes. The lacquer in the hole cures and forms a solder stop in the through-holes. Said solder stop thereby prevents the liquid solder from passing through the through-hole by the solder stop made of solder resist lacquer preventing the solder from flowing down and wetting the walls of the through-hole.

More concretely, the invention relates to a method where the viscosity of the solder resist lacquer is chosen so that the solder resist lacquer always flows down in one or more through-holes. Thereafter parts of the product are delimited so that non-transparent and transparent surfaces cover the lacquer. The non-transparent surfaces which cover said through-holes completely or partially surround transparent center surfaces. A subsequent illumination of the solder resist lacquer then takes place from both sides of the product. This means that the solder resist lacquer in the holes is illuminated partly through the earlier mentioned transparent center surfaces on one side of the product, and partly through the openings of the through-holes on the opposite side of the product. In this way, said solder stop is formed in the through-hole when the solder resist lacquer is polymerized, i.e. cured.

A device for producing said delimitation is formed according to the invention by a mask which comprises the said non-transparent and transparent surfaces, where the non-transparent surfaces completely or partially surround certain predetermined transparent center surfaces.

The advantages of the present invention is that it is simple and very cheap to perform. The invention can be performed with existing equipment and as a part of already known production steps, which means that it does not take any extra time in the manufacturing process. The invention is suitable both for small series production and for mass production. No extra material is required to be inserted in the through-hole in order to prevent the solder from passing through the through-holes.

The invention can be performed during different types of soldering, e.g. wave soldering and re-flow soldering.

DESCRIPTION OF THE DRAWINGS

The invention will now be described with reference to the appended drawings.

FIG. 8 shows a number of examples of cross sections of solder stops.

FIG. 9 shows a cross section of a double-sided printed board with a solder stop and a soldered component.

PREFERRED EMBODIMENTS

As mentioned earlier, solder resist lacquer is used to protect the electrically conducting surfaces on a printed board against moisture and corrosion and to limit the spreading of the solder along the conducting surfaces. Three common methods for applying solder resist lacquer on a surface of a printed board product are curtain coating, electrostatic coating and screen printing.

Photopolymeric coating or silk screen printing means that a solder resist lacquer is screen printed onto the surface of the product. A silk screen template is produced with the help of a photographic method. The template is placed over the printed board product before the lacquer or paint is poured over the template. With the help of a rubber rake the lacquer or paint is pressed through the template down onto the printed board product.

Curtain coating means that the product passes a curtain of photographically sensitive lacquer which covers the whole surface of the product. The thickness of the lacquer on the product is controlled i.a. by varying the viscosity of the lacquer and/or the speed of the product through the curtain of lacquer.

Electrostatic coating means that the lacquer is sprayed on an electrically charged printed board product. Otherwise it is the same process as curtain coating.

Viscosity which is a measure of the inner friction of a fluid, is often given by the unit dPas (deciPascalsecond, 0.1 N s/m$^2$). An alternative method for defining the viscosity is DIN 53 211f which gives the time (in seconds) which it takes for the fluid to form a drop.

A solder resist lacquer can comprise one or more types of curing agents which can cure in one or more stages after different types of treatment. A normally present solder resist lacquer cures in a first stage with UV-light and in a second stage with heat. During the curing the lacquer polymerizes. This means that the characteristics of the lacquer change in such a way that the lacquer becomes hard and resistant to damage.

An example of a printed board which is used for microwave applications is a so-called micro strip.

Figure 1:
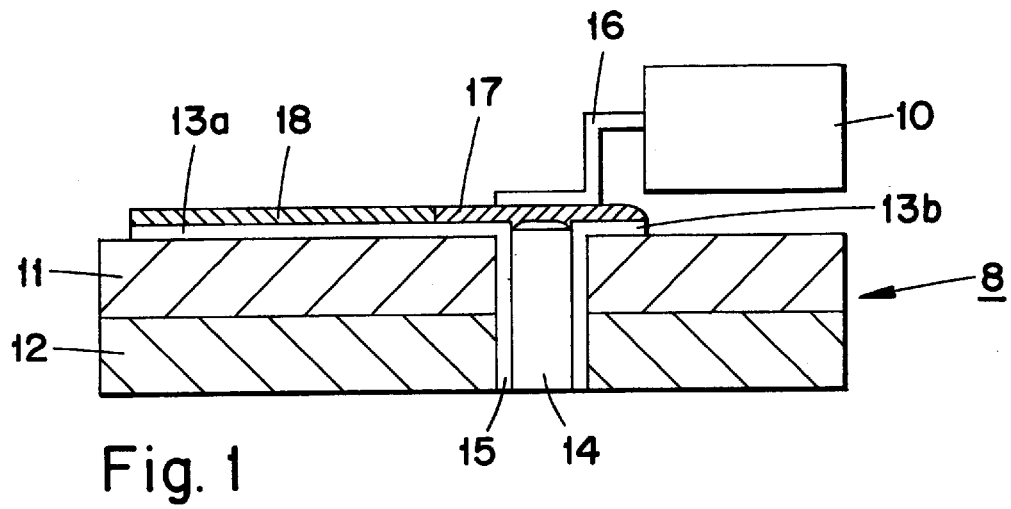
FIG. 1 shows a cross section of an enlarged part of a micro strip with a through-hole and a component.

FIG. 1 shows a longitudinal cross section of a micro strip 8 with a component 10 attached to its upper side. The micro strip 8 comprises on the one hand an electrically insulating layer 1, a so-called laminate, and on the other hand an earth plane 12 consisting of an electrically conducting material, e.g. copper or nickel, under the insulating layer 11. A pattern of electrically conducting material 13a–b, e.g. copper conductor, is applied over the insulating layer. A solder resist lacquer 18 is applied on a certain part of the pattern 13a–b. The earth plane 12 on the underside functions as the return conductor of the current in the pattern 13a–b on the upper side of the micro strip 8. One through hole 14 is shown in the Figure. The hole 14 is through-plated 15 with an electrically conducting material, e.g. copper. This hole 14, which is called a through-hole, is intended as an earth connection between one leg 16 of the component and the earth plane 12. The leg 16 is fixed in the micro strip 8 by means of soldering, whereby a soldering point 17 is formed.

If the solder during re-flow soldering becomes liquid, it will flow down into the through-hole 14, which as mentioned earlier can lead to the soldering of the component 10 being considerably deteriorated. The solder stop which is produced with the present method is intended to prevent said problem.

Figure 2:
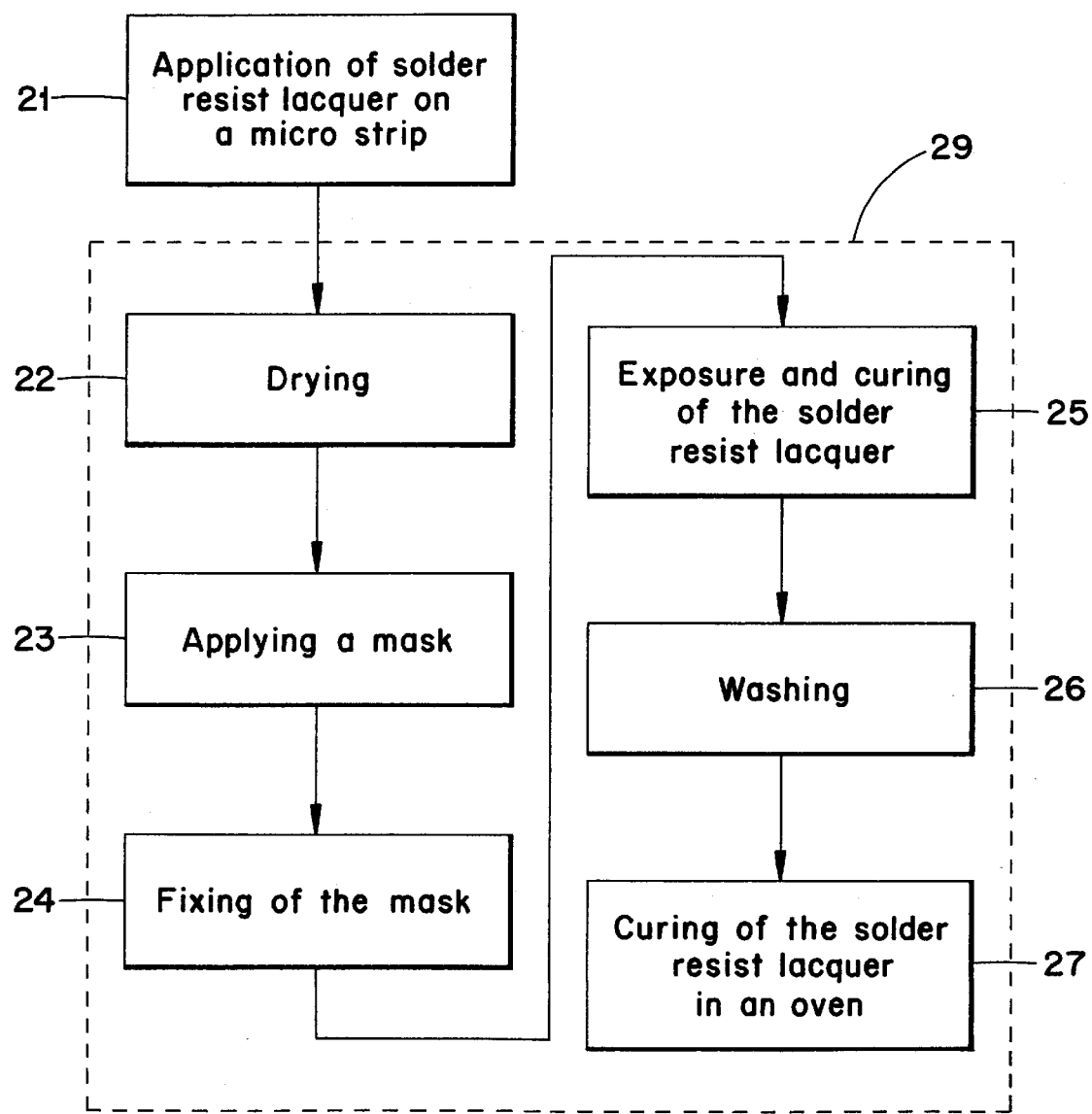
FIG. 2 shows a flow diagram of an embodiment of the suggested method according to the invention.

A first example of the method according to the invention is shown in a flow diagram in FIG. 2. In a first step 21 a solder resist lacquer 18 is applied onto a micro strip 8, wherein the viscosity of the solder resist lacquer is chosen so that the solder resist lacquer 18 flows out over the micro strip 8 and down in the through-hole 14, preferably at least 0.3–0.4 mm down in the hole.

Figure 3:
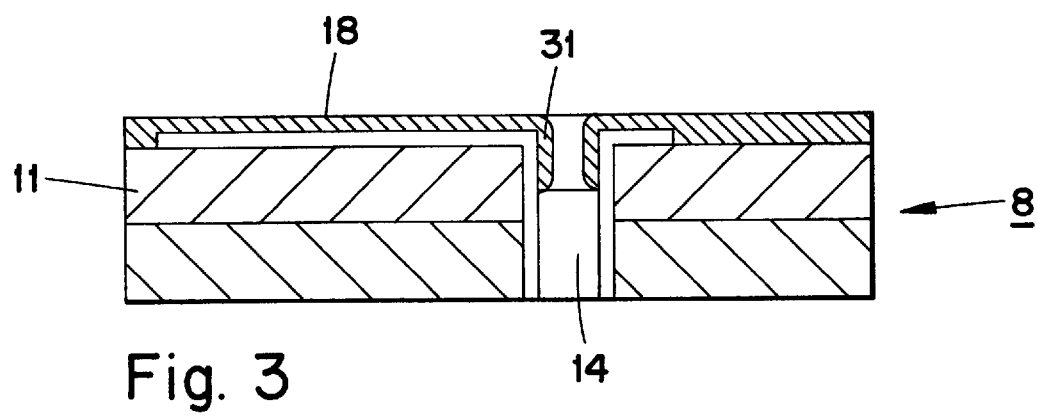
FIG. 3 shows a cross section of a micro strip according to a second step in the method shown in FIG. 2.

In a second step 22 the solder resist lacquer 18 is dried on the micro strip 8 and in the through-hole 14, whereby a ring 31 of lacquer is formed in the hole, see FIG. 3. The drying can take place, for example, by means of a fan, in a drying machine or by self drying.

In a third step 23 certain parts of the micro strip are delimited. The delimiting can take place, for example, through a mask 41, see FIG. 10, with predetermined transparent 42a–b and non-transparent 43a–f surfaces being placed over the dried solder resist lacquer 18, see FIG. 4, wherein a transparent center surface 44, which is completely surrounded by a non-transparent surface 43a on the mask 41, is centered over an upper opening 53 in the through-hole 14.

In a fourth step 24, according to FIG. 2, the mask 41 is fixed to the solder resist lacquer 18.

In a fifth step 25 predetermined parts of the solder resist lacquer 18 on the micro strip 8 and in the through-hole 14 are exposed to UV-light, whereby the parts of the solder resist lacquer 18 which are exposed to UV-light cures (polymerize) a first time.

In a sixth step 26 the mask 41 is removed, whereafter the micro strip 8 is cleaned so that the parts of the solder resist lacquer 18 which are not cured (polymerized) are removed from the micro strip 8.

In a seventh step 27 the micro strip 8 is placed in a oven, wherein the solder resist lacquer is cured (polymerizes) completely by the heat in the oven a last time. The remaining completely cured ring 31 of solder resist lacquer in the through-hole 14 has thereby formed a solder stop 61, see FIG. 6, which can prevent liquid solder from passing through the through-hole 14.

FIG. 3 shows a longitudinal cross section of the micro strip 8 after the second step 22, as is described in connection with FIG. 2. The solder resist lacquer 18 is applied on the laminate 11. The solder resist lacquer 18 has flowed down to into the through-hole 14 and formed the ring 31.

Figure 4:
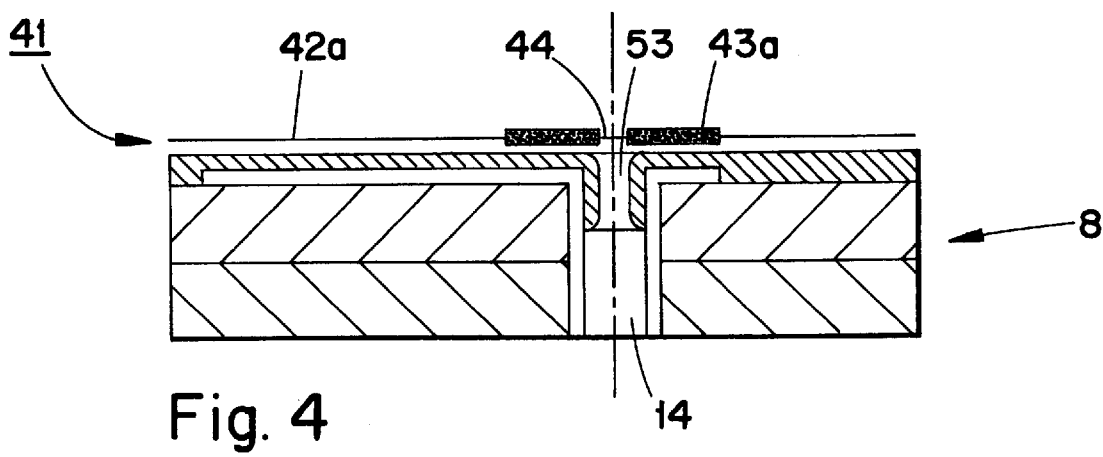
FIG. 4 shows a cross section of the above mentioned micro strip with a mask applied, according to a third step in the method shown in FIG. 2.

FIG. 4 shows the above cross section after the third step 23, as is described in connection to FIG. 2. The mask 41 with a transparent surface 42a and the non-transparent surface 43a is placed over the micro strip 8. The transparent center surface 44 is centered over the upper opening 53 in the through-hole 14.

Figure 5:
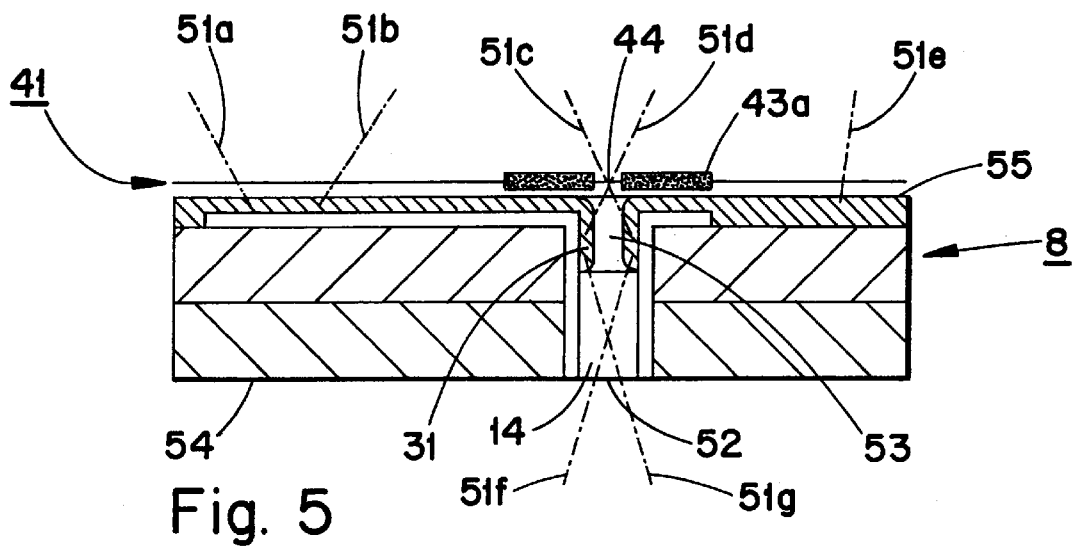
FIG. 5 shows a cross section of the above mentioned micro strip during UV-illumination according to a fifth step in the method shown in FIG. 2.

FIG. 5 shows the above cross section during a fifth step 25, as described in connection with FIG. 2. The UV-light, the ray path of which is shown by the dashed lines 51a–g, falls against the ring 31 of solder resist lacquer, partly through the center surface 44 (rays 51c–d) and partly through a lower opening 52 (rays 51f–g) in the through-hole 14 on an underside 54 on the micro strip 8. The non-transparent surface 43a on the mask 41 extends a little bit out over the upper opening 53 of the through-hole, whereby only the inclined instant UV-light through the center surface 44 can reach down to the solder resist lacquer 18 in the through-hole 14. This means that only that part of the solder resist lacquer 18 which is situated between the upper opening 53 of the through-hole and its lower opening 52 can be reached by the UV-light.

Figure 6:
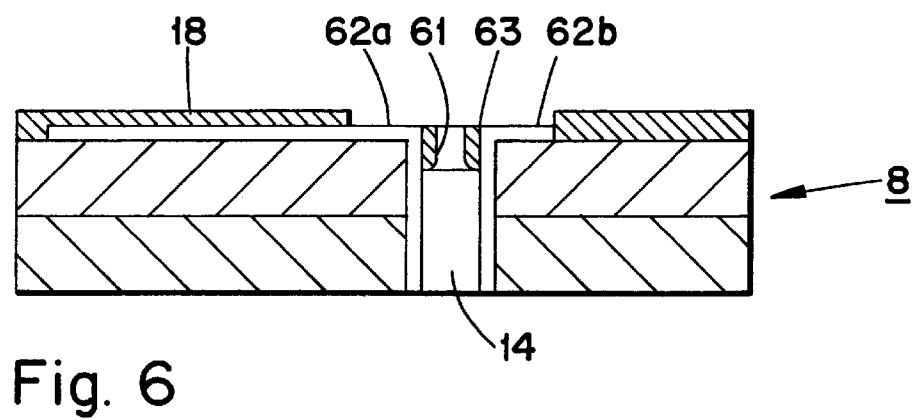
FIG. 6 shows a cross section of the above mentioned micro strip after a seventh step in the method shown in FIG. 2.

FIG. 6 shows the above cross section after the seventh step 27, as is described in connection with FIG. 2. The micro strip 8 is coated with a protective layer of solder resist lacquer 18 and equipped with the solder stop 61 in the through-hole 14. A region 62a–b around an edge 63 of the through-hole 14 has, because of the non-transparent surface 43, remained free from the solder resist lacquer, whereby a pad is formed.

Figure 7:
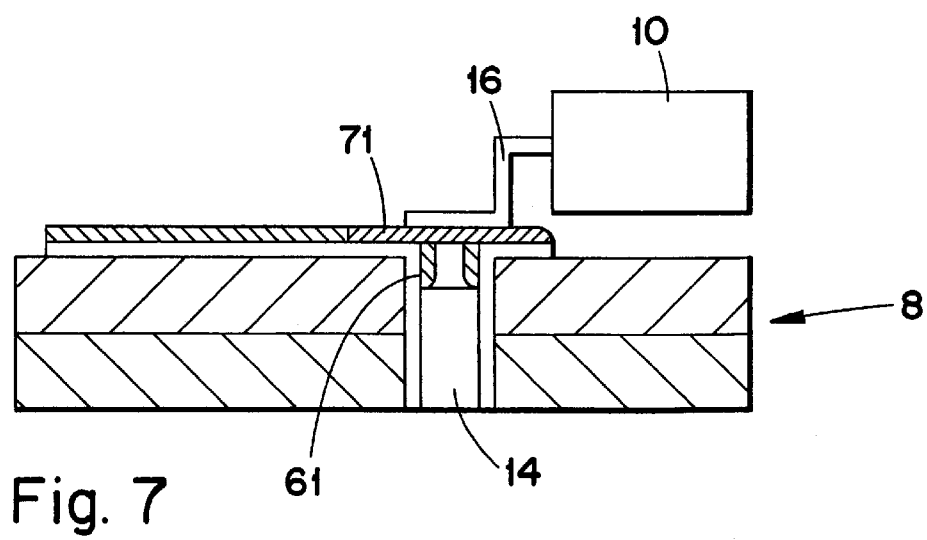
FIG. 7 shows a cross section of the above mentioned micro strip with a solder stop and a soldered component.

FIG. 7 shows a longitudinal cross section of the micro strip 8 with the component 10 attached by means of solder 71 on the upper side of the micro strip. The solder 71 around the leg 16 of the component is prevented by the solder stop 61 from flowing down into the through-hole 14 when melted.

The above described method in accordance with the invention for forming a solder stop in a single through-hole can advantageously even be performed on several through-holes 14 at the same time.

A laser can replace UV-light during the exposure of the solder resist lacquer.

FIG. 8 shows a number of examples of cross sections of different embodiments 81–84 of the solder stop. The solder stop can be a closed ring 81, 83 or a partially closed ring 82, 84, which follows the contour of the hole. The partially closed ring comprises a number of sections 85 with a certain mutual distance 86. The sum of the lengths of said distances 86 should not be greater than ¼ of the total circumference of the ring 82, 84.

The first step 21 in the method according to the invention can advantageously during screen printing be performed with a solder resist lacquer 18 with a viscosity within a range of 128 to 130 dPas.

During curtain coating the flowing downwards of the lacquer can be adjusted by adjusting the feed speed of the printed boards which pass through the curtain of lacquer or by adjusting the viscosity of the lacquer. Depending on which type of lacquer and process is used, different feed speeds and viscosities can be used. For example, for CIBA-GEIGY's process Probimer®, a suitable speed is 95–98 m/s.

For Lackwerke PETERS ELPEMER® GL 2496 SM, which is a solder resist lacquer, a viscosity of about 60 s (according to DIN 53 211f) is suitable.

The method according to the invention can even be applied to double-sided printed boards and multilayer printed boards.

A double-sided printed board comprises a pattern of electrically conducting material on both sides of the printed board.

A multilayer printed board comprises a plurality of patterns of electrically conducting material with electrically insulating material between these patterns. This forms a printed board with several layers of said pattern.

The method according to the invention is performed in the same way as the earlier mentioned method for the micro strip.

FIG. 9 shows a longitudinal cross section of a double-sided printed board 91 with the solder stop 61 in the through-hole 14 between an upper side 92 and a lower side 93 of the printed board.

Figure 10:
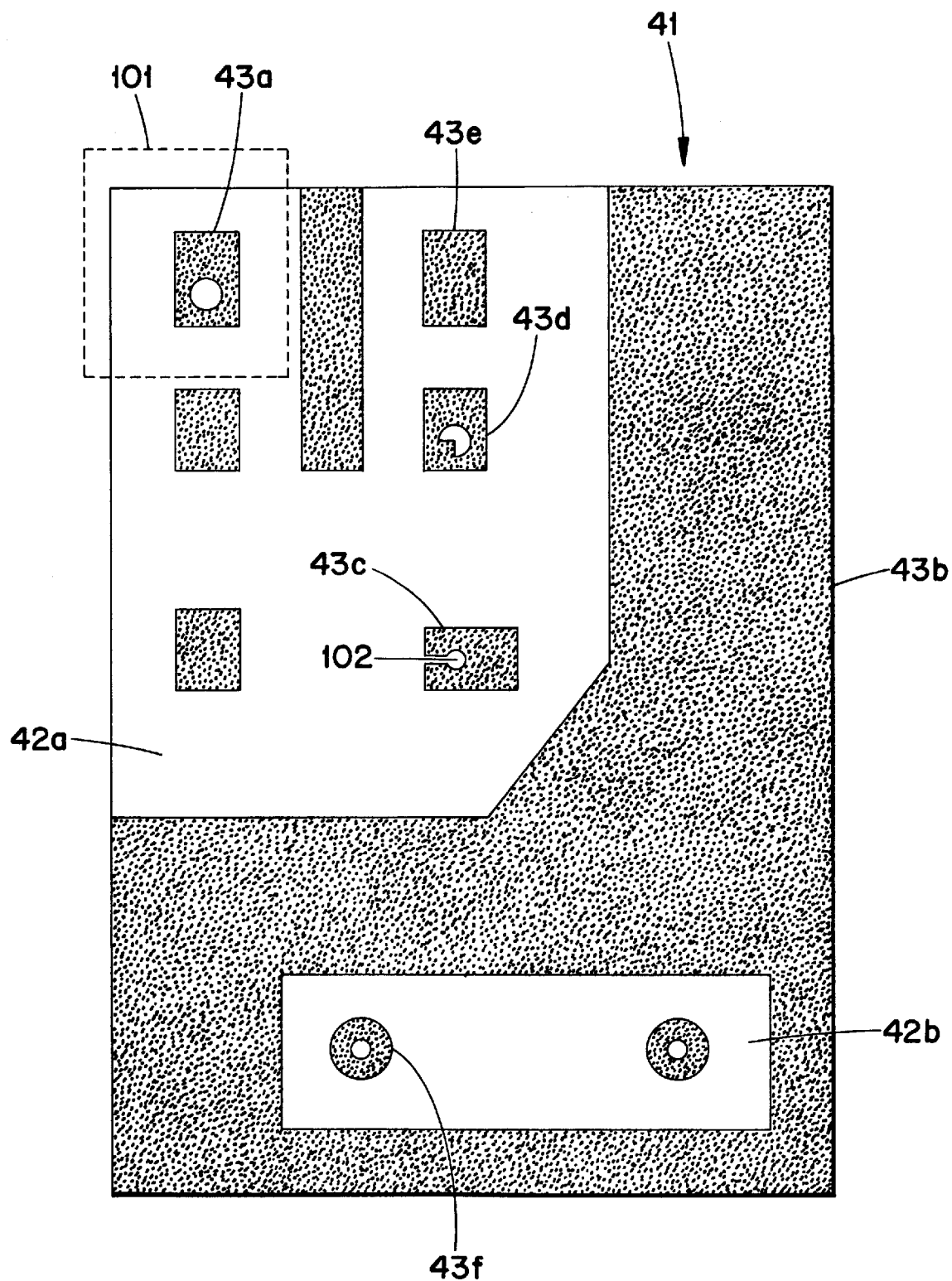
FIG. 10 shows a view of a mask.

FIG. 10 shows an example of a device according to the invention which is used in the above described method according to the invention. The device consists of a mask 41 designed so that light which falls on the mask 41 reaches down into the through-hole 14, FIG. 5, on the micro strip 8. The mask 41 has transparent surfaces 42a–b and non-transparent surfaces 43a–f, which show different examples of possible embodiments which for the sake of simplicity are put together in one Figure. The mask 41 can, for example, consist of a transparent film with black surfaces. The transparent surfaces 42a–b cover the surfaces of the micro strip 8 which are to be coated with the solder resist lacquer 18. The non-transparent surfaces 43a–f cover the surfaces of the micro strip 8 which are not to be coated with the solder resist lacquer, for example, certain solder surfaces 62a–b, see FIG. 6.

FIG. 10 also shows a center surface 102, which is partially surrounded by the non-transparent surface 43c.

Figure 11:
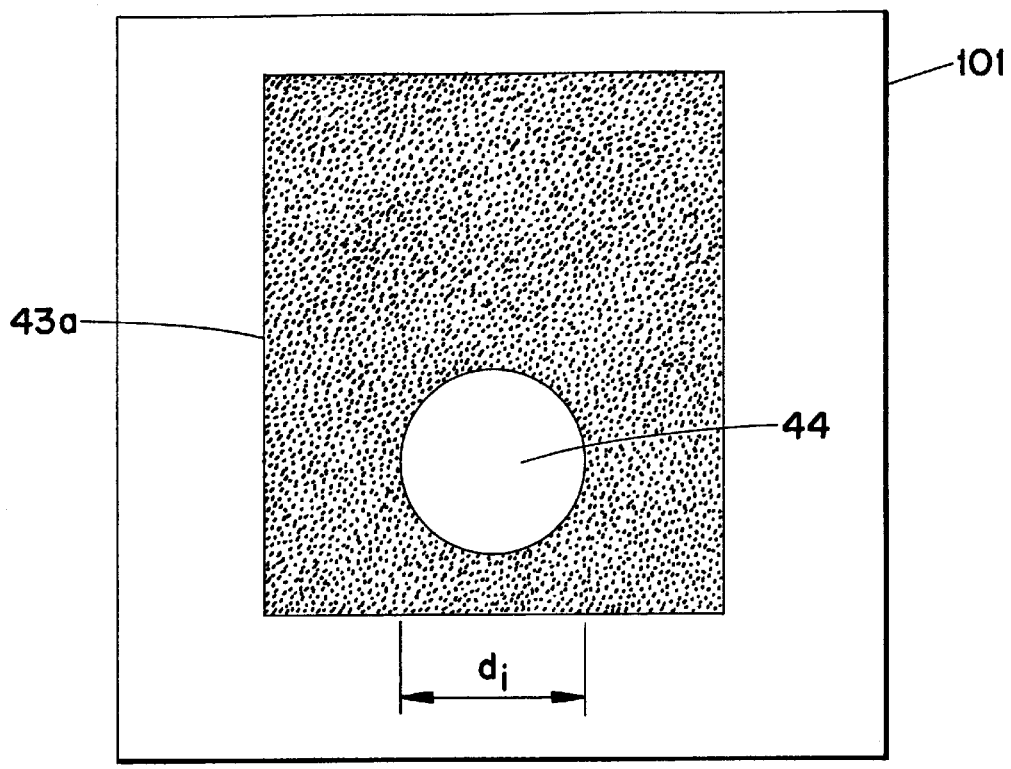
FIG. 11 shows a partial view of a mask with a center surface in its center.
Figure 12:
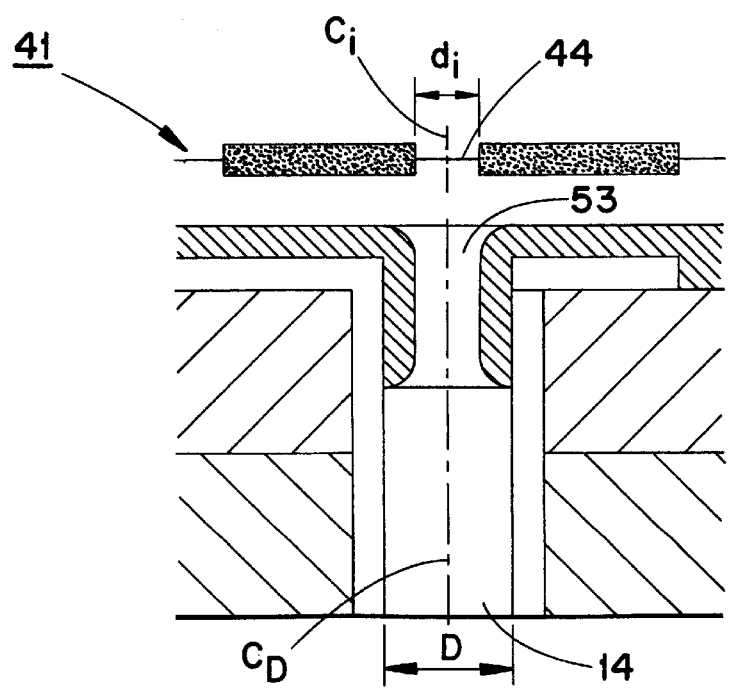
FIG. 12 shows a detail enlargement of FIG. 4.

FIG. 11 shows an enlarged part 101 of the mask 41 with the non-transparent surface 43a, which completely surrounds a center surface 44. The transparent center surface 44 is placed over the hole 14, see FIG. 12, which is to be provided with the solder stop. The transparent center surface 44 has a width $d_i$ and the hole 14 has a width D. The width $d_i$ of the center surface is to be less than the width D of the hole. This means that the light which falls through the center surface 44 reaches the solder resist lacquer 18 under the upper opening 53 of the hole 14. The center of the center surface $C_i$ is centered over the center $C_D$ of the hole.

The mentioned embodiments of the invention are applicable on printed boards and especially for micro strips.

What is claimed is:

1. A method for the manufacturing of solder stop in at least one through plated hole, arranged in a pad to which a component is to be soldered, on a product having a pattern of conductors of electrically conducting material, where the hole in the product has an opening on each side of the product, said method comprising the steps of:

applying a solder resist lacquer on the product in order to enable a portion of said applied lacquer to flow down into a top part of the plated hole; and retaining a ring-shaped portion of the applied solder resist lacquer that has flowed in said top part of the hole while removing the lacquer from at least said pad wherein said ring-shaped portion allows air to flow through said plated hole and said solder stop is formed by the retained ring-shaped portion of the solder resist lacquer in the top part of the hole.

2. The method of claim 1 wherein said product is a printed board of electrically insulating material.

3. The method according to claim 1, wherein said retaining step comprises the further steps of:

fixing of a mask having a pattern of transparent and non-transparent surfaces over the lacquer on the product;

exposing the mask to light whereby the regions of the lacquer which are covered by the transparent surfaces of the mask are exposed in order to make a predetermined region of the lacquer in the hole more resilient; and removing the regions of the lacquer which have not altered their resilience by a predetermined method based on the type of lacquer whereby the predetermined region forms the solder stop.

4. The method of claim 3 comprising the further step of:

curing the lacquer on the product in a heat oven after the removal of the lacquer.

5. The method of claim 3 wherein the product with the lacquer is exposed from both sides whereby the exposure reaches the lacquer in the hole partly through a transparent center surface that is partially surrounded by a non-transparent cover surface on the mask where the mask covers one of said sides of the product and partially through a lower opening of the hole on another of said sides of the product.

6. The method of claim 3 wherein the lacquer is exposed to ultra violet (UV) light for polymerizing portions of the lacquer which are exposed to form the solder stop and non-polymerized portions of the lacquer are washed away according to a predetermined method based on the type of lacquer.

7. The method of claim 1 wherein the lacquer flows down at least 0.3 mm in the hole wherein the 0.3 mm distance is calculated from the edge of an opening of the hole that is placed on a side of the product where the lacquer is applied.

8. The method of claim 1 wherein the product is a micro strip.

9. The method of claim 1 wherein a viscosity of the lacquer is selected to enable the lacquer to flow down in the plated hole.

10. The method of claim 1 wherein the lacquer is applied by curtain coating.

11. The method of claim 10 wherein a feed speed of the product through a curtain of lacquer is selected to enable the lacquer to flow down in the plated hole.

12. The method of claim 10 wherein a viscosity of the solder is applied to enable the lacquer to flow down in the plated hole.

13. The method of claim 1 wherein the lacquer is applied through screen painting.

14. The method of claim 12 wherein the viscosity of the lacquer varies from 128 to 130 dPas.

15. The method of claim 1 wherein the lacquer is applied through electrostatic coating.

* * * * *